United States Patent
Bengtsson et al.

(10) Patent No.: US 6,340,890 B1
(45) Date of Patent: *Jan. 22, 2002

(54) METHOD AND DEVICE FOR LOCATING PARTIAL DISCHARGES IN AN ELECTRIC HIGH-VOLTAGE APPARATUS

(75) Inventors: Tord Bengtsson, Västeras; Mats Leijon, Västeras, both of (SE)

(73) Assignee: ABB Research, Ltd., Zurich (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/849,448
(22) PCT Filed: Dec. 4, 1995
(86) PCT No.: PCT/SE95/01448
§ 371 Date: Aug. 6, 1997
§ 102(e) Date: Aug. 6, 1997
(87) PCT Pub. No.: WO96/18112
PCT Pub. Date: Jun. 13, 1996

(30) Foreign Application Priority Data
Dec. 5, 1994 (SE) .............................. 9404209

(51) Int. Cl.⁷ ............................................... G01R 31/08
(52) U.S. Cl. .................. 324/536; 324/547; 324/535
(58) Field of Search ............................... 324/532, 535, 324/536, 546, 547

(56) References Cited

U.S. PATENT DOCUMENTS

| | | | |
|---|---|---|---|
| 3,622,872 A | | 11/1971 | Boaz ............................ 324/536 |
| 3,728,619 A | | 4/1973 | Harrold et al. .............. 324/536 |
| 4,158,168 A | * | 6/1979 | Harrold et al. .............. 324/535 |
| 4,158,169 A | * | 6/1979 | Harrold et al. .............. 324/535 |
| 4,158,468 A | * | 6/1979 | Harrold ....................... 324/535 |
| 5,233,305 A | * | 8/1993 | Nishizawa et al. .......... 324/547 |
| 5,530,366 A | * | 6/1996 | Nasrallah .................... 324/547 |

FOREIGN PATENT DOCUMENTS

| | | | |
|---|---|---|---|
| EP | 0 518 508 | | 5/1992 |
| JP | 62-186243 | * | 8/1987 |
| JP | 1-185458 | * | 1/1988 |
| JP | 63-47678 | * | 2/1988 |
| JP | 1-145585 | * | 6/1989 |
| JP | 8-320356 | * | 12/1996 |

OTHER PUBLICATIONS

Phung et al., Partial Discharge Ultrasonic Wave Propagation In Steel Transformer Tanks, 7th International Symposium On High Voltage Engineering, Technische Universitat Dresden, Aug. 26–30, 1991, pp. 131–134.

* cited by examiner

Primary Examiner—Safet Metjahic
Assistant Examiner—Vincent Q Nguyen
(74) Attorney, Agent, or Firm—Connolly Bove Lodge & Hutz LLP

(57) ABSTRACT

A method and apparatus for location of partial discharges in an electric high-voltage apparatus, such as a power transformer, which is arranged in a container filled with an insulating medium is provided. At least three ultrasonic detectors are applied with mutually known positions on the outside of the container and in acoustic contact therewith. The times of arrival of a wavefront arriving at the detectors and originating from a partial discharge are determined, and on the basis of the times of arrival and on the basis of the known mutual positions of the detectors, the direction the partial discharge is determined.

14 Claims, 8 Drawing Sheets

METHOD AND DEVICE FOR LOCATING PARTIAL DISCHARGES IN AN ELECTRIC HIGH-VOLTAGE APPARATUS

TECHNICAL FIELD

The invention relates to a method for locating partial discharges in an electric high-voltage apparatus, such as a power transformer, which apparatus is arranged in a container filled with an insulating medium, in which a number of ultrasonic detectors are disposed in different detector positions on the outside of the container and in acoustic contact therewith, the times of arrival for an acoustic wavefront arriving at the detectors and originating from a partial discharge are determined, and from the times of arrival and the distances between the detector positions, information for locating the partial discharge is derived.

The invention also relates to a device for locating partial discharges in an electric high-voltage apparatus, such as a power transformer, which is arranged in a container filled with an insulating liquid. The device comprises a number of ultrasonic detectors adapted to be disposed outside the container and in acoustic contact therewith, and time measuring means connected to the detectors for determining the arrival times for an acoustic wavefront arriving at the detectors and originating from a partial discharge.

BACKGROUND ART

It is previously known that partial discharges (referred to as "PDs" in the following) in electric high-voltage apparatuses, such as large power transformers, are associated with emission of ultrasound. It is also known to detect and to attempt to locate PDs with the aid of ultrasonic detectors. Two methods for location are described in Phung, James, Blackburn, Su: "Partial Discharge Ultrasonic Wave Propagation in Steel Transformer Tanks", $7^{th}$ International Symposium on High voltage Engineering, Technische Universität Dresden, Aug. 26–30, 1991, pp. 131–134.

In a first method, there is used, for example, an ultrasonic detector which is moved between different positions on the outside of a transformer tank. In each position, the time of a PD is detected electrically, and the time of the arrival of the corresponding acoustic signal at the detector is detected with the aid of the ultrasonic detector. In this way, assuming a linear propagation with a known velocity, the distance from each detector position to the current PD is obtained. With the aid of the thus obtained distances from, for example, four detector positions and with the aid of the measured detector positions, the position of a PD may be determined by triangulation. This method is also known from U.S. Pat. No. 3,622,872.

In a second method, the difference in time between the arrival of the acoustic wavefront at two ultrasonic detectors arranged at different locations is used. Assuming a linear propagation with a known velocity, the measured difference in time together with the detector positions defines a hyperboloid which constitutes the locus of the detected PD. By using an additional pair of detectors—or by moving the same detector pairs to new positions—a second hyperboloid may be determined, which together with the first hyperboloid enables location of the PD.

However, the accuracy of location of these known methods has been very low. The position determination methods used require long base lines, that is, large distances between the detectors, to obtain a reasonable accuracy. The propagation of the acoustic waves from a PD to a sensor is, however, of complicated nature. The acoustic waves pass through different materials—oil, insulating material, windings, the wall of the transformer tank—with different acoustic velocities, and the waves therefore do not generally propagate rectilinearly with a certain constant and known velocity. The acoustic waves from a PD to a number of detectors placed at various locations and at a relatively large distance from one another will therefore, with these known methods, generally have completely different propagation routes, which is the reason for the low accuracy of the known methods of location.

Owing to the requirement for long base lines, it is not practically possible, with these known method of location, to arrange the detectors in a common measurement device. These methods therefore require a movement of a detector or a detector pair between a plurality of different measurement positions, or alternatively, the arrangement of a larger number, for example three or four, of detectors in known positions. This makes the methods slow and complicated and they require measurement of each measurement position relative to the other measurement positions. Further, the calculations are complicated since, during each measurement, the calculations have to be based on the detector configuration which is used at that particular time.

U.S. Pat. No. 3,728,619 describes a further method, wherein two or four detectors are used, which are mounted in a common measurement device and rotatable in pairs. The detectors in one pair are rotated until the phase difference between the signals received by the detectors becomes zero, which gives the direction to the PD. Thereafter, the distance may be obtained by rotating the detector pair through a known angle and observing the phase difference between the signals. This measurement device becomes complicated and clumsy because the detectors must be rotatable in pairs and because of the requirement for good acoustic coupling between the detectors and the walls of a transformer tank or the like. Further, the measurement will be slow and requires a larger number of repeated PDs, which reduces the usefulness of the device in practice.

SUMMARY OF THE INVENTION

The invention aims to provide a method and a device of the kind mentioned in the introductory part of the description, which make possible simple, rapid and accurate location of partial discharges in electric high-voltage apparatus.

What characterizes a method and a device according to the invention will become clear from the appended claims.

In a method and a device according to the invention, one single measurement fixture with at least three detectors fixedly mounted thereto is used, and the directional determination is made by determining the difference between the arrival times at the detectors for an acoustic wavefront caused by a PD.

In this way, the complicated and time-consuming positioning and position measurement of a plurality of separate detectors are avoided, which results in a rapid and simple measurement method. The fixed detector configuration further permits the use of significantly simpler and, if desired, preprogrammed equations.

Since the detectors are fixedly mounted in a measurement fixture, this is simple in design and handling and hence economically advantageous. Further, no successive adjustment of detector orientations is required, and hence, in principle, only one single PD is required for a position determination.

The directional determination with the aid of the time differences between the arrival of a wavefront at the detectors, used in the method according to the invention, makes possible a very accurate measurement also with a short base line. The measurement fixture can therefore be designed compact and simple to handle without lowering the requirements for measurement accuracy.

BRIEF DESCRIPTION OF THE DRAWINGS

The invention will be described in greater detail in the following with reference to the accompanying FIGS. 1–8. FIG. 2a shows the detector unit seen from the side (in a direction parallel to the wall of the transformer tank where the unit is intended to be located), and FIG. 2b shows that surface of the unit which faces the transformer tank.

DESCRIPTION OF THE PREFERRED EMBODIMENTS

Figure 1:
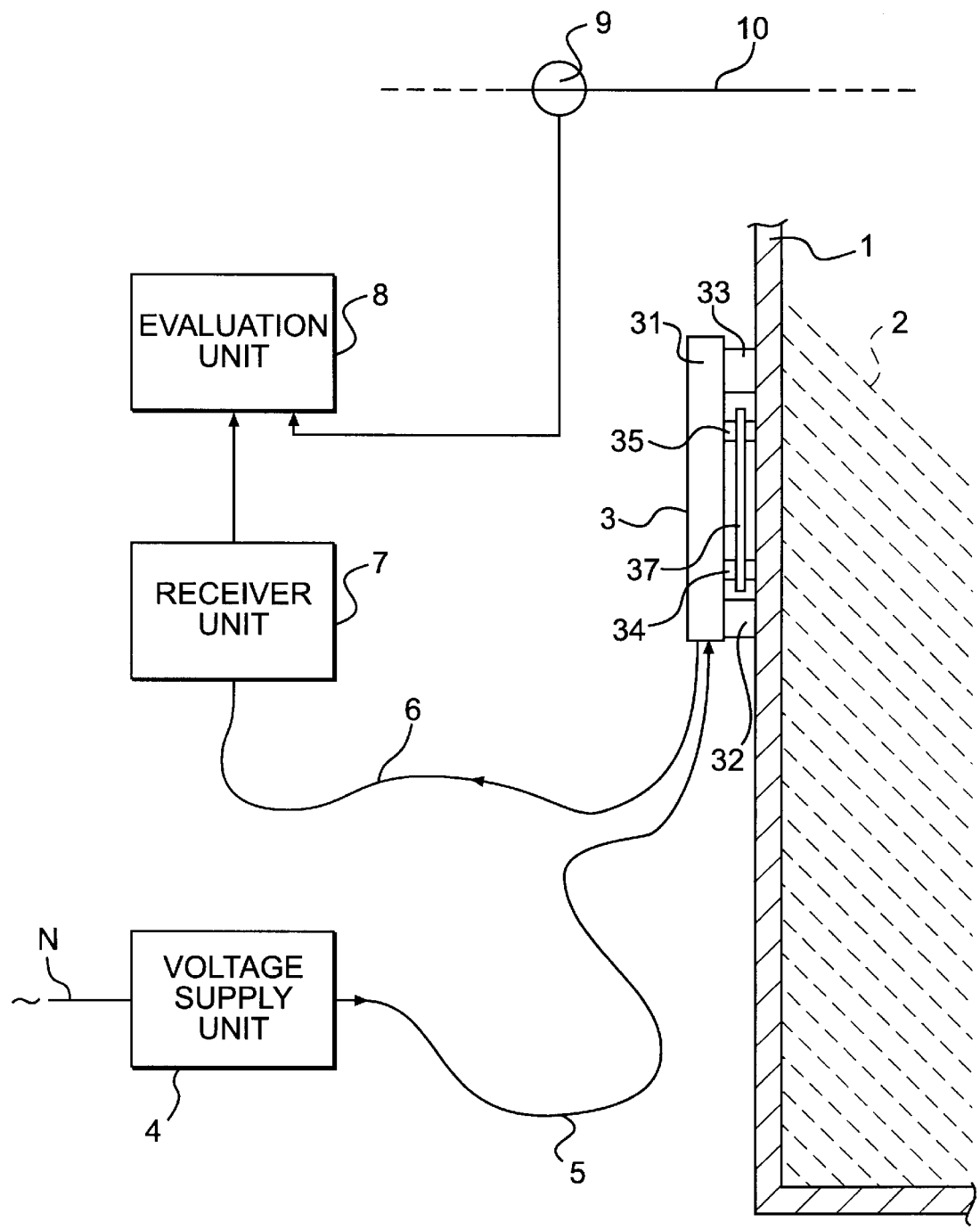
FIG. 1 shows the main features of a device according to one embodiment of the invention.

FIG. 1 shows an example of a device according to the invention. It comprises a detector unit 3 with a frame 31, which supports three detectors, of which detectors 34, 35 are shown in FIG. 1. The unit is intended to be applied to the outside of the wall 1 of a transformer tank, made of steel plate, of a large power transformer. The interior of the transformer tank is filled with oil 2 and contains the active parts (not shown in the figure) of the transformer (core, windings, etc.). The frame 31 of the detector unit supports two magnets 32 and 33, with the help of which the unit is retained in the desired position on the wall 1 and with the detectors in contact with the wall. A voltage supply unit 4 supplies the detector unit 3 with the necessary electrical power in the form of 15 V direct voltage via a cable 5. The output signals from the three detectors of the unit are fed via an optical cable 6 to a receiver unit 7, where the detector signals are transformed into electric signals and signal processing in the form of filtering and amplification is performed to bring the signals into a suitable form for further evaluation. The signals from the receiver unit 7 are supplied to an evaluation unit 8.

Figure 2A:
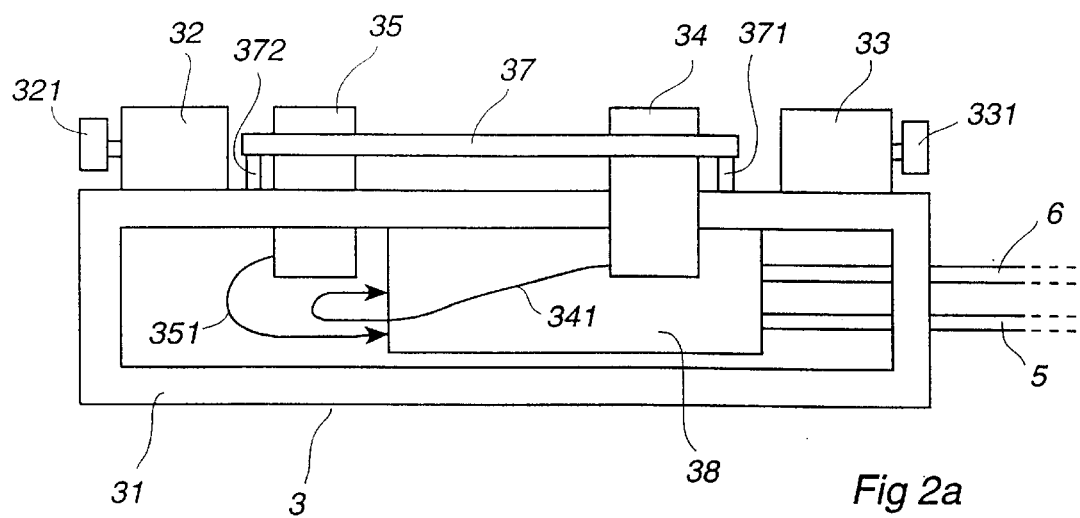
FIGS. 2A–B shows in more detail the detector unit in the device shown in FIG. 1.
Figure 2B:
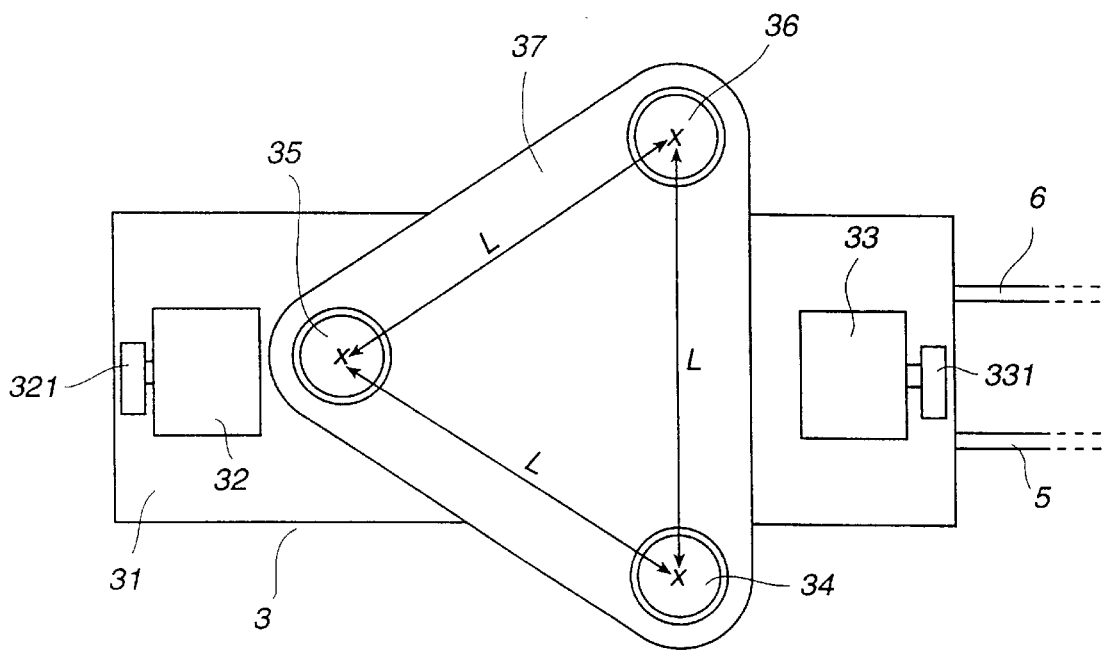

The detector unit is shown in more detail in FIG. 2, wherein FIG. 2a shows the unit seen from the side and FIG. 2b shows that surface of the unit which is facing the transformer. The frame 31 has the shape of a framework and, at its opposite ends, supports the magnet means 32 and 33 for applying the unit on the wall of a transformer tank. The magnet means comprise permanent magnets, which are rotatable between two positions with the aid of handles 321 and 331 in such a way that the magnet force may be switched on and off. A detector holder in the form of a substantially triangular metal plate 37 is mounted on the frame with the aid of supports 371, 372. The plate is provided at its corners with circular openings, in which the three substantially cylindrical detectors 34, 35, 36 are mounted. The detectors are mounted to the plate 37 with the aid of elastic fixing members in such a way that they can adapt their orientation to the possibly not completely flat surface of the wall of a transformer tank.

The detectors are of a piezoelectric type, know per se, preferably of a so-called damped type, and, for example, of the Physical Acoustic Corporation, type PAC R6I, manufacture, with a maximum sensitivity within a frequency range from about 20 kHz to about 200 kHz. This frequency range has proved to be suitable in most cases in practice. In case of very thin container walls, primarily higher frequencies are transferred along the wall, and in such walls it may be suitable to use detectors with a larger frequency range than that just mentioned.

At that end of the detector which is intended to be brought into contact with the wall of a transformer tank, each detector comprises a piezoelectric transducer. Further, each detector comprises a preamplifier for amplification of the transducer signal. When mounting the detectors to the wall of, for example, a transformer tank, some suitable medium, for example, oil or grease, is suitably used in a manner known per se in order to obtain a good acoustic contact between the wall and the detectors.

The output signals from the detectors, that is, from their preamplifiers, are supplied via signal cables—the cables 341 and 351 being shown in the figure—to an optical transmitter unit 38 where the three detector signals are transformed into optical signals. These are transferred, in turn, with the aid of the optical cable 6 to the receiver unit 7. The necessary power supply of the preamplifiers of the detectors and of the transmitter unit 38 is obtained with the aid of the cable 5.

In spite of the fact that the transformer tank 1 is grounded, transient overvoltages of a high amplitude may arise in the wall of the tank, for example during a short-circuit. By using an optical cable for transmission of the detector signals, such overvoltages are effectively prevented from propagating to the receiver 7 and the evaluation unit 8. The cable 5 is made so long as to have a sufficient inductance to reduce any overvoltages occurring to a harm-less level, in cooperation with overvoltage protective means (e.g. zener diodes or gas-discharge tubes) arranged in the current-supply unit 4. Extra inductances, for example with ferrite cores, may possibly be connected into the cable 5 to further increase its inductance. In this way, efficient protection against overvoltages and interference is obtained for the current-supply, signal-processing and evaluation units (4, 7, 8) included in the equipment. Further, adequate personal protection is obtained. Finally, overvoltages and interference are efficiently prevented from propagating to the network N which feeds the current-supply unit 4.

The receiver unit 7 comprises an optical receiver part for converting the optical signals, arriving via the cable 6, into electric signals corresponding to the three detector signals. The optical channel for transmission of the detector signals may operate with frequency or time-multiplex transmission on a common channel or, alternatively, consist of three separate channels with three separate transmitters, three optical fibres and three receivers.

Further, the receiver unit comprises filters, for example bandpass filters, and amplifiers for the detector signals. The filters and the amplifiers are suitably designed such that their band width and amplification may vary in dependence on the conditions prevailing during each individual measurement.

The output signal of the receiver unit is supplied to the evaluation unit 8. This comprises members for analysis and determining the time of the detector signals which are caused by acoustic waves from a partial discharge arriving at the detector unit. It may consist of a digital oscilloscope which stores and presents the three detector signals, whereby, in the manner described below, an analysis of the detector signals is made possible and a determination of the direction and possibly also the distance to the discharge may be made. Alternatively, the evaluation unit may comprise members for storage of the detector signals as well as members which automatically analyze the signals and, for example through some correlation method, calculate the time differences between the signals and therefrom calculate the direction to the discharge.

As will be shown below, a determination of the direction to a PD can normally be made without knowledge of the total transit time of the wavefront and only on the basis of the time differences between the arrival times of the wavefront at the three detectors (and in certain cases also additional information about the position of the discharge may be obtained). The possibility of an accurate and complete location, and then above all of a distance determination, is increased if also the total transit time of the wavefront can be determined. For this purpose the device according to the invention suitably comprises an electric detector which senses the time of a PD. Such a detector may, for example, be designed as a current transformer 9, which, in those cases where this is possible in practice, may be arranged around a lead 10 of the high-voltage apparatus. A PD causes a current pulse through the lead. This causes the current transformer to supply a pulse to the evaluation member 8, which may thus determine the transit time for the wavefront to each one of the three detectors.

In the embodiment described here, the detectors are arranged with their centres at the corners of an equilateral triangle with the side L=0.15 m.

Figure 3:
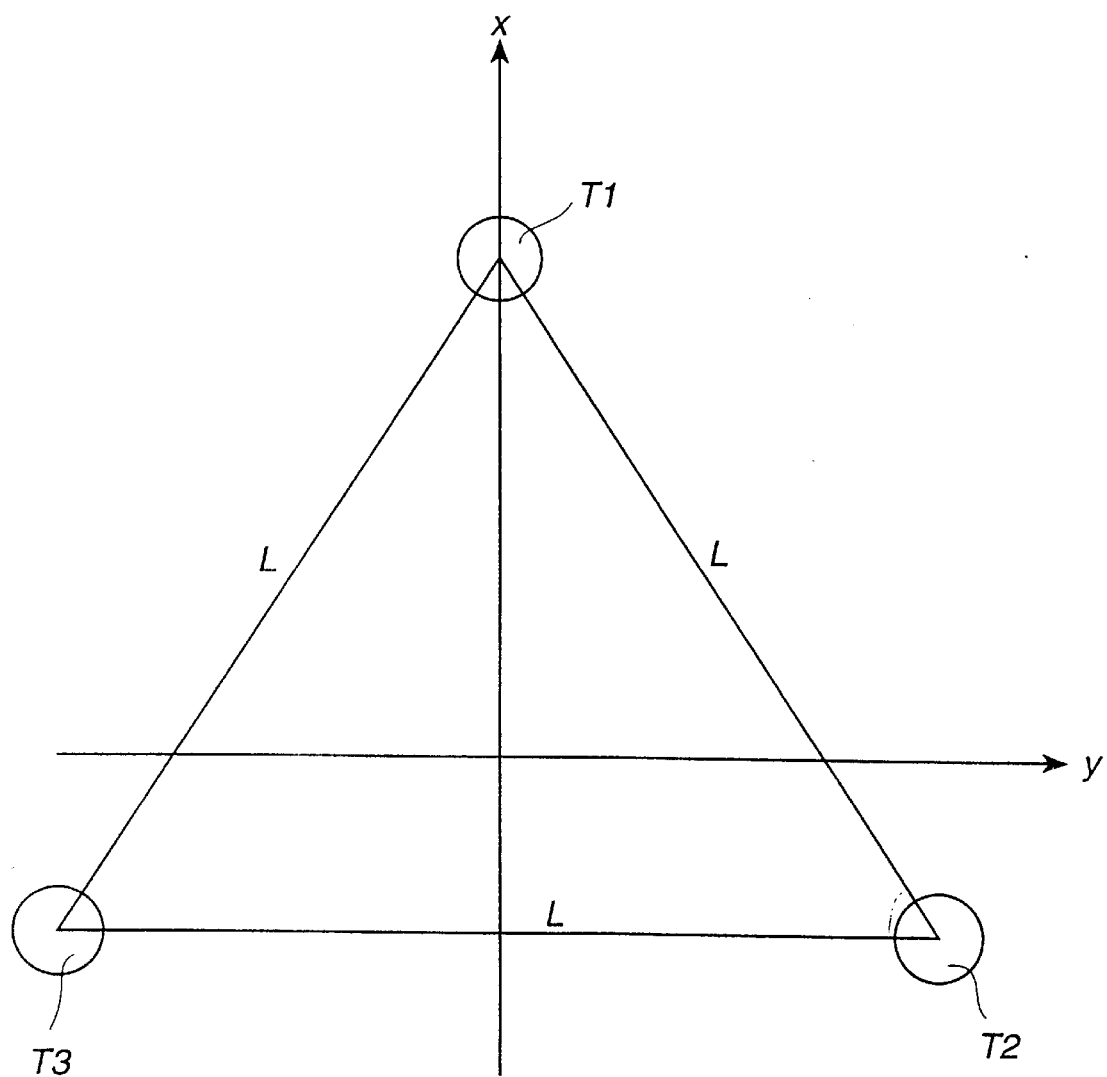
FIG. 3 shows the location of the three detectors in the coordinate system used during the location.

FIG. 3 shows how a coordinate system is arranged with its x- and y-axes in the plane of the wall 1 and with its origin of coordinates at the centre of the equilateral triangle. The coordinates of the detectors (T1, T2, T3) in this system are then

T1: (L/√3, 0)

T2: (−L/2 √3, L/2)

T3: (−L/2 √3, −L/2)

Figure 4:
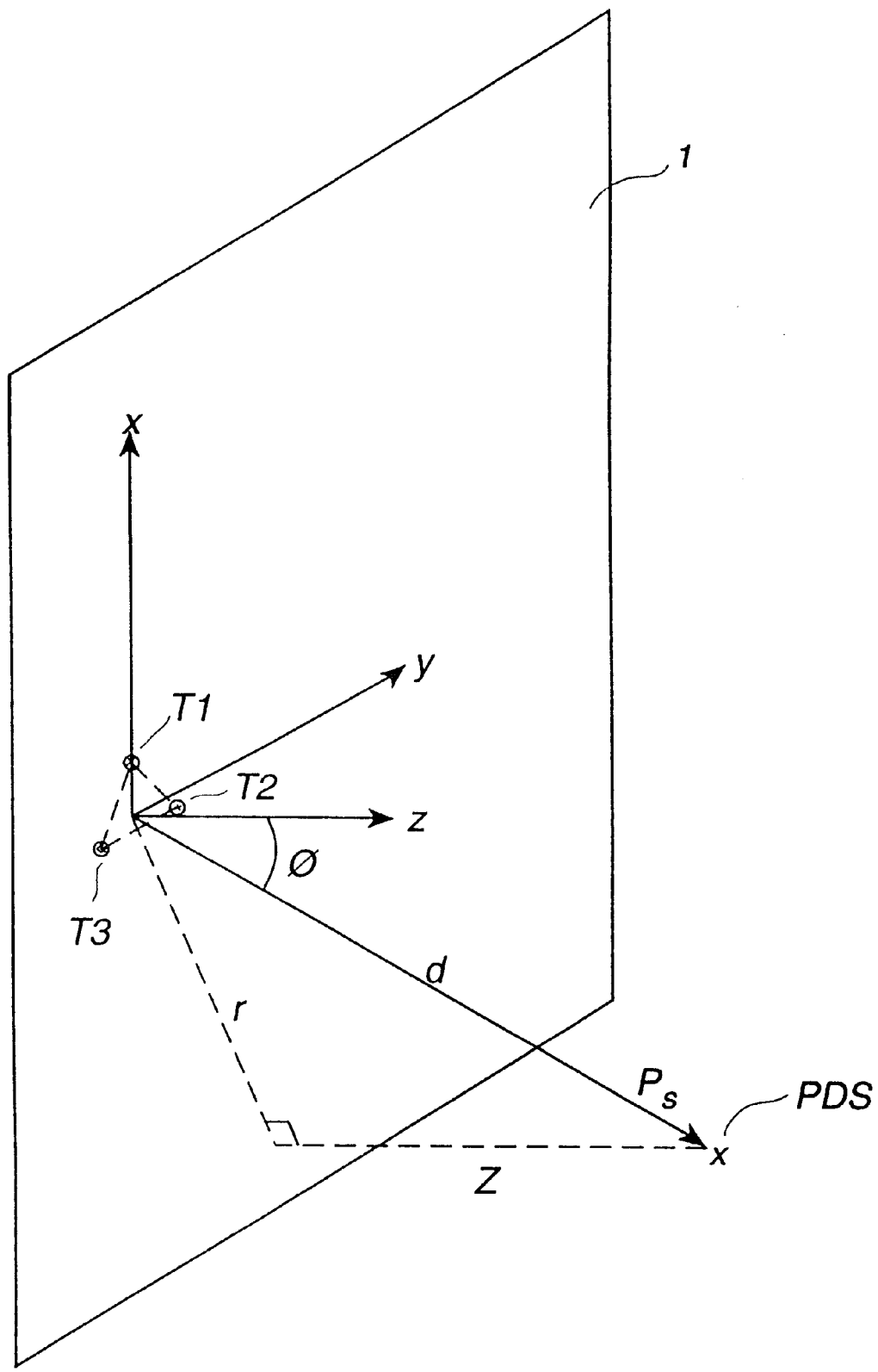
FIG. 4 shows the position of the sound source in the coordinate system.

FIG. 4 shows symbolically the wall 1 of the transformer tank and the three detectors T1–T3 applied to the wall, which have the three above-mentioned positions in the x-y plane. FIG. 4 further shows a z-axis which together with the x- and y-axes forms a three-dimensional orthogonal coordinate system. A partial discharge constitutes a sound source PDS, the position of which is described by the vector $p_s$. The direct distance from the sound source to the detector system is designated d, its distance in the x-y plane from the origin of coordinates is designated r, and its distance to the same plane is designated Z. The vector $p_s$ has the components X=x d Y=y d Z=z d where $$\sqrt{X^2 + Y^2 + Z^2} = d$$
$$\sqrt{x^2 + y^2 + z^2} = 1$$

The full coordinates of the transducers are

T1: (L/√3, 0, 0)

T2: (−L/2 √3, L/2, 0)

T3: (−L/2 √3, −L/2, 0)

Figure 5:
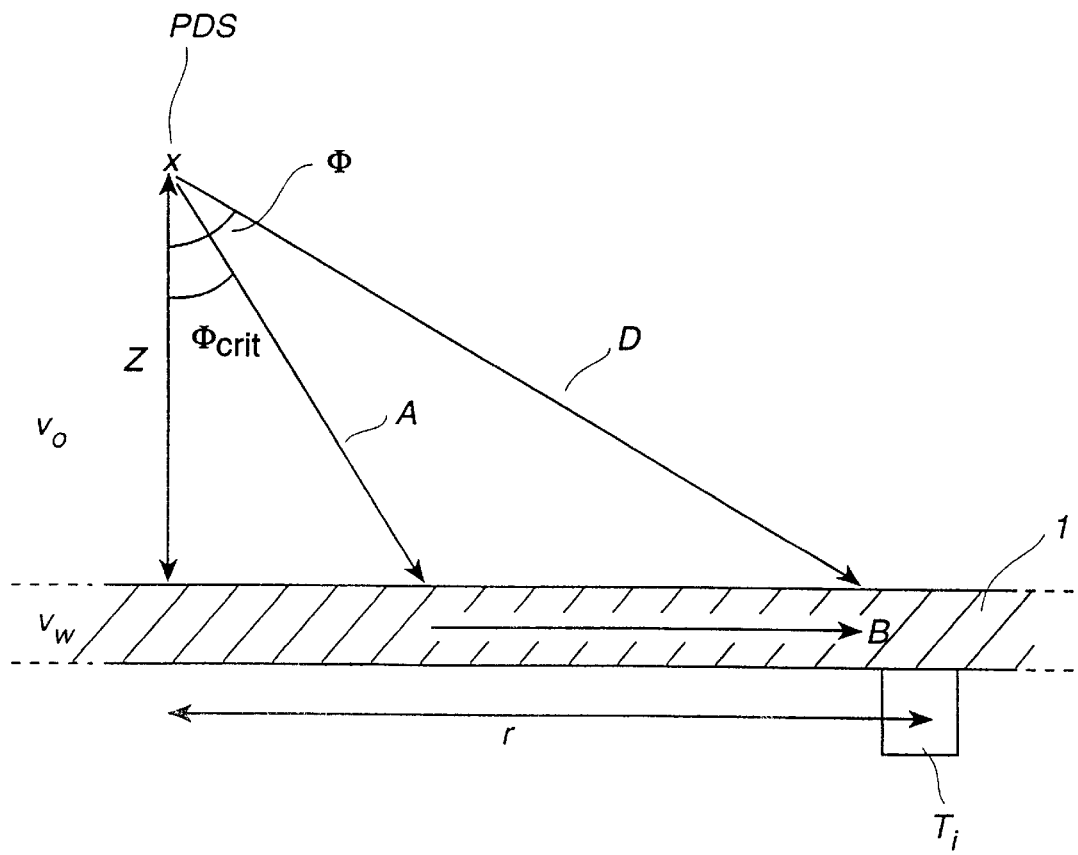
FIG. 5 illustrates the direct propagation of the acoustic waves and the propagation of the acoustic waves through the wall to a detector.

FIG. 5 shows, in a plane perpendicular to the wall 1, the sound source PDS and a detector Ti.

The acoustic velocity in the medium (the oil) inside the tank is $v_o$ and the acoustic velocity in the wall 1 is $v_w$. The acoustic velocity in the wall (steel plate) is significantly higher than the velocity in transformer oil. In the oil, sound propagates only as longitudinal waves. In the wall, sound propagates both as longitudinal and as transversal waves, where the velocity of longitudinal waves is significantly greater than that of transversal waves. Typical approximate values are for oil $v_0$=1400 m/s for steel $v_w$=$v_t$=3200–3350 m/s (transversal waves)

—"— $v_w$=$v_l$=5200–5800 m/s (longitudinal waves)

where the higher values for steel apply if the material has large dimensions perpendicular to the direction of propagation. For steel plate lower values are obtained, and the lower values stated are typical of the plate thicknesses used for transformer tanks.

An acoustic wave from the source PDS may, in principle, propagate to the detector in two ways, either as a direct wave D or first through the oil—arrow A—and then through the wall of the detector—arrow B. It can be shown that the fastest propagation path from the source to the detector is a direct wave if the angle of incidence φ (the angle between the acoustic waves and the normal of the wall) for the direct wave is smaller than an angle $φ_{crit}$ partially through the wall in the manner shown in FIG. 5 if the angle of incidence φ for the direct wave is larger than $φ_{crit}$ where $$\sin φ_{crit} = v_o/v_w \tag{1}$$

The angle $φ_{crit}$ has, for the transition from oil to steel, the values

26° for transversal waves

16° for longitudinal waves

Further, it can be shown that the transmission path A-B shown in FIG. 5 gives the greatest acoustic pressure transferred from the oil to the wall, and, further, the damping during the propagation in the wall is low. The acoustic pressure of waves which are transferred along the wall to the detector therefore tends to become high, which facilitates the detection. This is especially true of the transversal waves which in typical cases have an acoustic pressure which is approximately six times higher than the acoustic pressure of the longitudinal waves.

According to the invention, in order to make possible location of a PD, the first part of the first acoustic wavefront which reaches the detector from the discharge is studied, that is, the wavefront which has taken the fastest route from the discharge to the detector.

For wall-propagated acoustic waves, for the reasons stated above, the longitudinal waves (a high velocity of propagation in the wall) which have a relatively low amplitude arrive first at a detector, and thereafter the transversal waves (a significantly lower velocity of propagation) which have a relatively high amplitude. These two wavefronts can therefore normally be distinguished from each other.

For wall-propagated waves the following applies $$t_{t(l)} = C_{t(l)}^{r} r + C_{t(l)}^{z} Z \quad (2)$$

where $$C_{t(l)}^{r} = \frac{1}{v_{t(l)}} \quad (2a)$$

$$C_{t(l)}^{z} = \frac{\sqrt{\left(\frac{v_{t(l)}}{v_0}\right)^2 - 1}}{v_{t(l)}} \quad (2b)$$

$v_0$ is the acoustic velocity in the oil $t_{t(l)}$ is the time of propagation of transversal (longitudinal) waves in the wall $v_{t(l)}$ is the time of propagation in the wall for transversal (longitudinal) waves The two times of propagation are measured, whereupon r and z may be solved from the above-mentioned expression:

$$r = C_r^t t_t + C_r^l t_l \quad (3a)$$

$$Z = C_z^t t_t + C_z^l t_l \quad (3b)$$

where $$C_r^t = \frac{v_t}{1 - \sqrt{\frac{v_t^2 - v_0^2}{v_l^2 - v_0^2}}} \quad (3c)$$

$$C_r^l = \frac{v_l}{1 - \sqrt{\frac{v_l^2 - v_0^2}{v_t^2 - v_0^2}}} \quad (3d)$$

$$C_z^t = -\frac{v_0 v_t}{\sqrt{v_l^2 - v_0^2} - \sqrt{v_t^2 - v_0^2}} \quad (3e)$$

$$C_z^l = -\frac{v_0 v_1}{\sqrt{v_l^2 - v_0^2} - \sqrt{v_t^2 - v_0^2}} \quad (3f)$$

Figure 6:
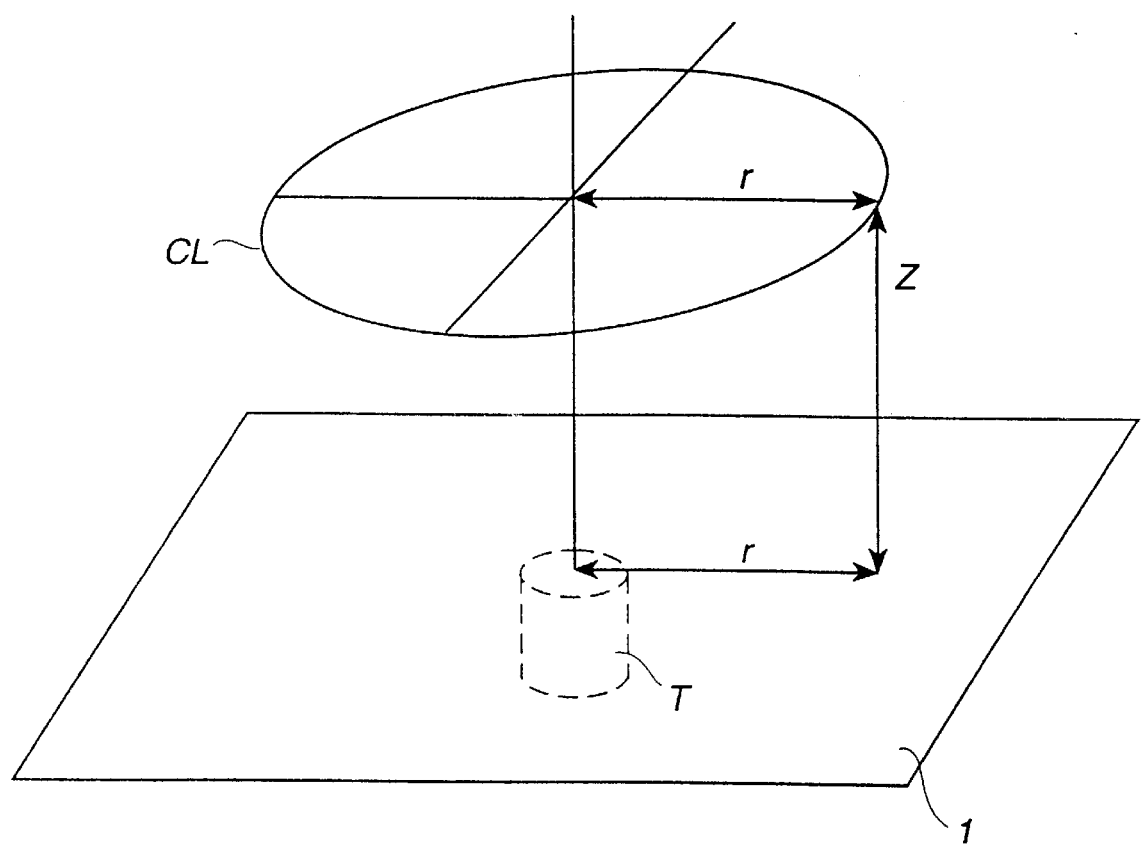
FIG. 6 shows how, with the aid of the time difference between a longitudinal and a transversal wave, respectively, arriving through the wall at the detector, the position of a sound source may be located in a circular line.

With the acoustic velocity values mentioned above ($v_o$=1400 m/s, $v_t$=3200 m/s, $v_l$=5200 m/s) the following is obtained $$r = 7522 \, t_t - 7023 \, t_l \quad (4a)$$

$$z = -2103 \, t_t + 3417 \, t_l \quad (4b)$$

that is, if both times of propagation $t_t$ and $t_l$ are known, the sound source is located at a circular line CL with a centre straight above the detector, with the radius r and located at the distance Z from the wall (see FIG. 6).

A location is obtained although the total times of propagation are not known, but only their difference $\Delta t_{lt} = t_t - t_l$. The expression will be $$r = \frac{1}{C_r^l - C_r^t} \{\Delta t_{lt} + Z(C_z^l - C_z^t)\} \quad (5)$$

that is, with the acoustic velocity values mentioned above ($v_o$=1400 m/s, $v_t$=3200 m/s, $v_l$=5200 m/s)

$$r = 8320 \, \Delta t_{lt} + 0.38 \, z \quad (6)$$

that is, the sound source is located at the surface of the frustum of a cone with its axis through the detector and perpendicular to the wall.

If only one of the two wavefronts can be observed, the sound source may be located at the surface of a cone which is determined by the expression $$r = v_t t_{t(l)} - Z \sqrt{\left(\frac{v_{t(l)}}{v_0}\right)^2 - 1} \quad (7)$$

which, with acoustic velocity values inserted, has the form (8a) r=3200 $t_t$–2.06 Z for the transversal wavefront (8b) r=5200 $t_l$–2.71 Z for the longitudinal wavefront By arranging the detectors close to each other, according to the invention, a high probability is obtained that the detectors are reached by wavefronts which, in principle, have had the same propagation path. This means that a reliable location of the sound source can normally be made. Further, according to the invention, detectors of mutually the same type are used. This, and the fact that the detectors are reached by, in principle, identical wavefronts, permits the time differences between the arrival times for a wavefront at the various detectors to be determined very accurately, which makes possible an accurate determination of the direction to the sound source.

For direct waves the following applies $$t = \frac{|p_s - p_t|}{v_o} \quad (9)$$

where $p_s$ is the position vector of the sound source (see FIG. 4)

$p_t$ is the position vector of the actual transducer t is the time of propagation $v_o$ is the velocity of propagation in the oil From the measured times of propagation, $t_1$, $t_2$ and $t_3$, for the three detectors, the time average value $t_{ave}$ is obtained as $$t_{ave} = \frac{t_1 + t_2 + t_3}{3} \quad (10)$$

With a good approximation the following applies $$t_{ave} = d/v_o \quad (11)$$

that is, the distance to the sound source is obtained as $$d = v_o \, t_{ave} \quad (12)$$

From the vector expression above the following is obtained $$X = \frac{v_o^2}{2\sqrt{3} L}(t_2^2 + t_3^2 - 2t_1^2) \quad (13a)$$

$$Y = \frac{v_o^2}{2L}(t_3^2 - t_2^2) \quad (13b)$$

$$Z = \sqrt{d^2 - X^2 - Y^2} \quad (13c)$$

where X and Y give the direction (and the distance) in the x-y plane to the sound source. The sound source is thereby completely located.

In many cases, however, the total times of propagation are not known but only the differences between the arrival times of a wavefront at the different detectors. From the exact expressions (13) above, the following approximate expres sions may be derived for the directional vector from the detector to the sound source $$x = \frac{\sqrt{3}\, v_o}{L}(t_{ave} - t_1) \quad (14a)$$

$$y = \frac{v_o}{L}(t_3 - t_2) \quad (14b)$$

$$z = \sqrt{1 - x^2 - y^2} \quad (14c)$$

These expressions apply with a good approximation, and their accuracy becomes greater the shorter the distances between the detectors.

For wall-propagated waves, the time-average value tave may be calculated according to (10) above, both for the longitudinal and for the transversal waves. From these two values, r oh Z are then obtained from (3) or (4) above. The direction in the x-y plane to the sound source may thereafter be determined in the following way.

To obtain an exact solution, the following quantity is introduced $$t'_w = t_w - C_w^z Z = C_w^r r \quad (15)$$

where $t_w$ is the total time of propagation of the wall-propagated wave $t'_w$ is the time of propagation of the wall-propagated wave in the wall, and where $C_w^z$ and $C_w^r$ are obtained from (2a) and (2b) above. With the aid of the values of $t'_w$ for the various detectors ($t'_1$, $t'_2$, $t'_3$) X and Y are obtained in a manner similar to that according to (13a) and (13b) above $$X = \frac{v_w^2}{2\sqrt{3}\,L}(t_2'^2 + t_3'^2 - 2t_1'^2) \quad (16a)$$

$$Y = \frac{v_w^2}{2L}(t_3'^2 - 2t_2'^2) \quad (16b)$$

These expressions are exact, but assumes knowledge of the total times of propagation. If only the differences between the times of propagation are known, the direction to the discharge may be determined, in a manner similar to that for direct waves, with the aid of the approximate expressions $$X/r = \frac{\sqrt{3}\, V_{app}}{L}(t_{ave} - t_1) \quad (17a)$$

$$Y/r = \frac{V_{app}}{L}(t_3 - t_2) \quad (17b)$$

which, in practice, apply with a good approximation at small distances between the detectors. In these expressions, the apparent velocity $V_{app}$ is a measure of the average time difference between the arrival times at the three detectors and is obtained from the expression $$V_{app} = \frac{L}{\sqrt{\frac{2}{3}\{(t_1 - t_2)^2 + (t_2 - t_3)^2 + (t_3 - t_1)^2\}}} \quad (18)$$

It has proved that a more reliable location may be obtained if $V_{app}$ is used in the expressions (17) above than if $V_w$ is used.

The apparent velocity $V_{app}$ can also be used for distinguishing direct waves from wall-propagated waves. Direct waves arrive at small angles of incidence smaller than $\phi_{crit}$. The time differences in the denominator of (18) above will then be small, which gives high values of $V_{app}$. Two cases can be distinguished:

| | |
|---|---|
| $V_{app} > V_t$ | A direct wave with the angle of incidence $\phi < \phi_{crit}$ |
| $V_{app} \approx V_t$ | Probably a transversal wall-propagated wave (possibly a direct wave with $\phi \approx \phi_{crit}$) |

Figure 7:
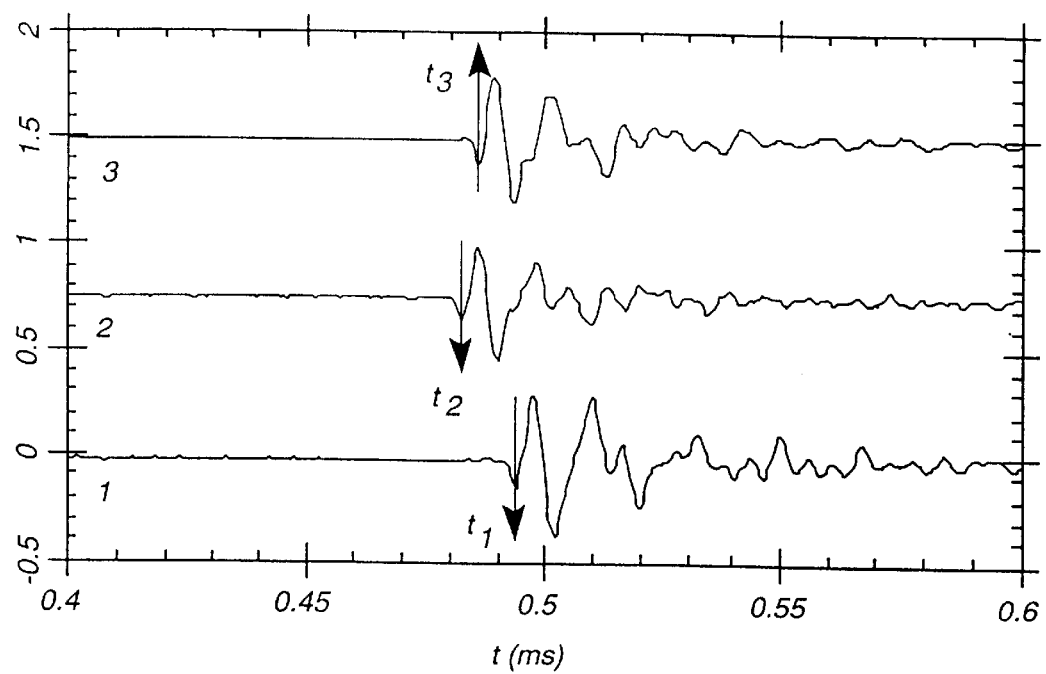
FIG. 7 shows an example of direct waves which are received by the three detectors of the device according to FIGS. 1–2.

An example of the method for a location according to the invention will be described with reference to FIG. 7, which shows the signals from the three detectors, which have been stored in a digital oscilloscope. The figure shows the signal amplitudes as functions of the time. The oscilloscope has been triggered by electrical detection of the time of the discharge. The distance L between the detectors was 0.15 m. The arrival time for the acoustic wave is defined as the time of the first amplitude peak, and the propagation times may with great accuracy be determined to be $t_1$=0.493 ms $t_2$=0.482 ms $t_3$=0.484 ms The apparent velocity is obtained from (18) as $V_{app}$=12 800 m/s that is, it is obviously the question of a direct wave.

The average propagation time is obtained from (10) as $t_{ave}$=0.4863 ms and the distance to the discharge from (11) as d=0.68 m With the aid of (14), the components of the directional vector are obtained x=−0.11 y=0.02 z=0.99 that is,

X=x d=−0.073 m

Y=y d=0.013 m

Z=z d=0.677 m and the discharge is completely located. The accuracy of the location was of the order of magnitude of one of a few cm.

Figure 8:
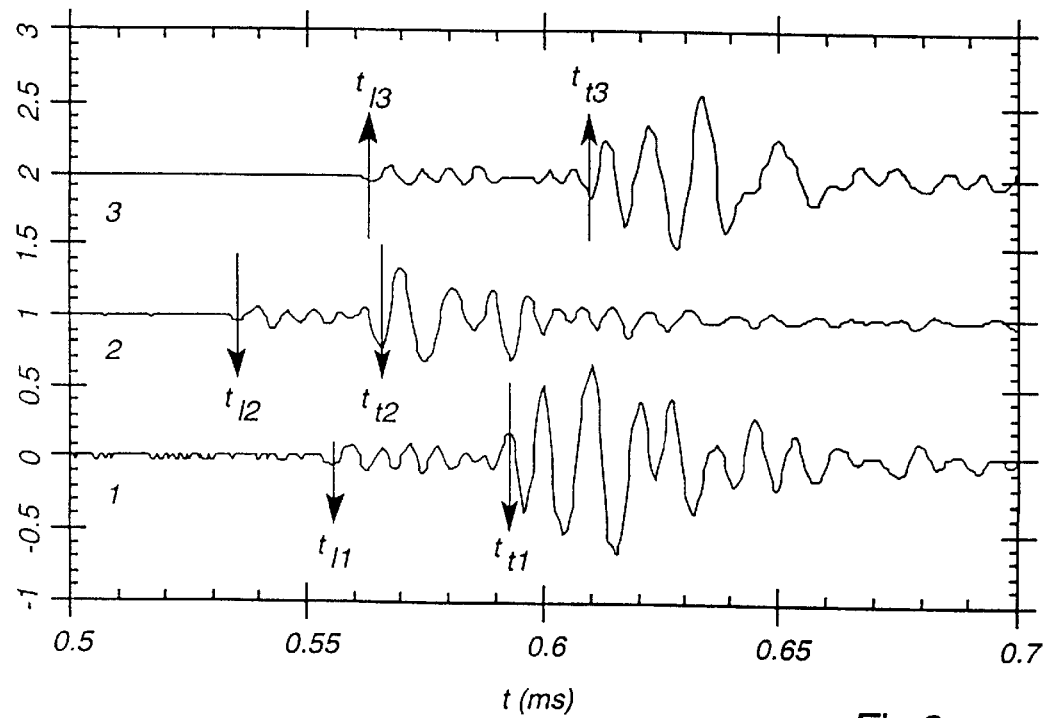
FIG. 8 shows an example of wall-propagated waves arriving at the three detectors.
Figure 9:
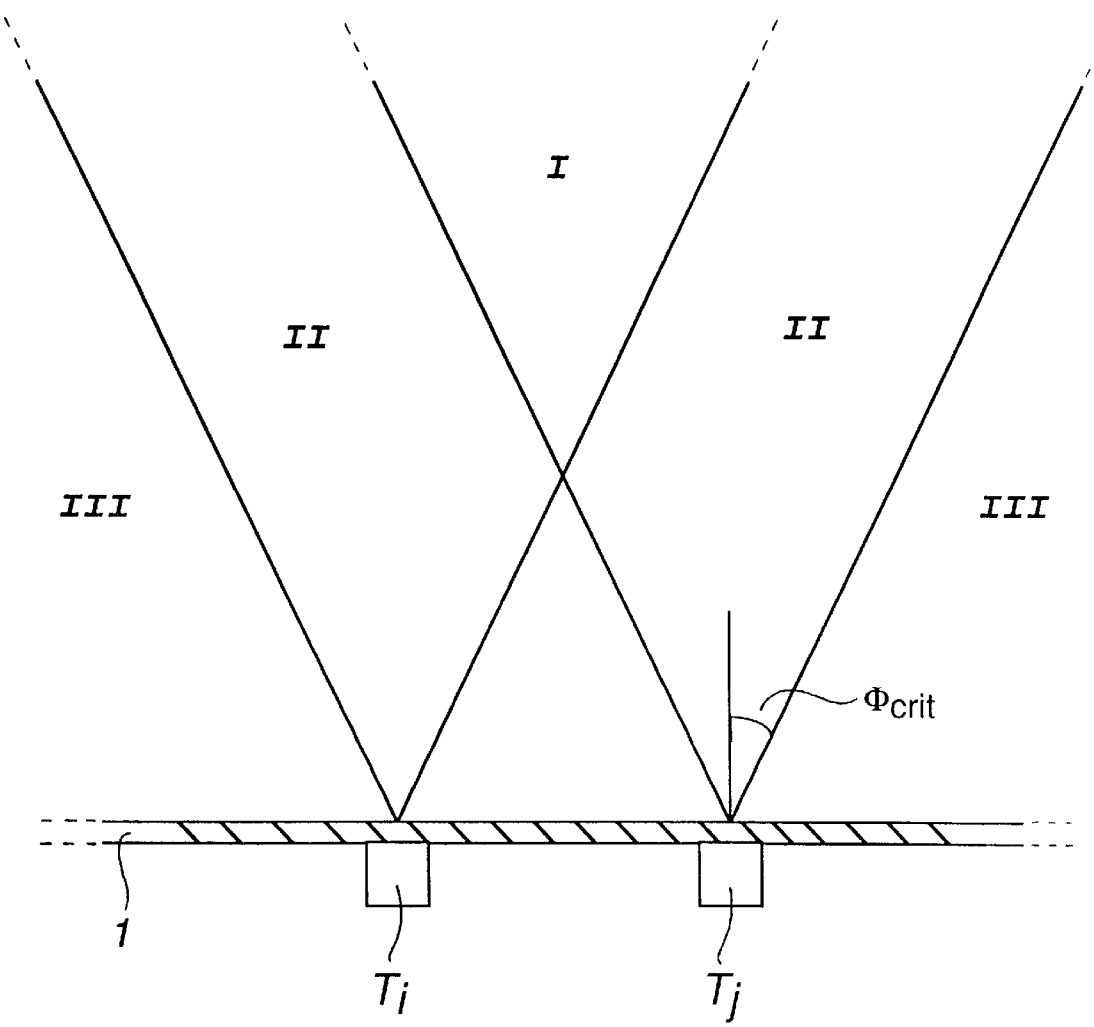

Another example will be described with reference to FIG. 8. The same detector unit is used, that is, L=0.15 m. As is clear from each detector signal, the longitudinal wave with a relatively low amplitude arrives first—at $t_{li}$—and then—at $t_{ti}$—the transversal wave with a significantly higher amplitude arrives. The Figure thus shows the typical course of events for wall-propagated waves. The following arrival times are obtained from the diagram

| | |
|---|---|
| $t_{l1}$ = 0.555 ms | $t_{t1}$ = 0.592 ms |
| $t_{l2}$ = 0.535 ms | $t_{t2}$ = 0.565 ms |
| $t_{l3}$ = 0.563 ms | $t_{t3}$ = 0.609 ms |

From (18) there is obtained for the transversal wave $V_{app}$=3380 m/s and for the longitudinal wave $V_{app}$=5200 m/s which corresponds well to the known acoustic velocities in steel plate for these two oscillation modes. This confirms that in this case it is a question of wall-propagated waves. From (10) the following are obtained $t_{ave}$=0.551 ms for the longitudinal wave $t_{ave}$=0.589 ms for the transversal wave whereafter, with the aid of (2), r and Z are calculated as r=0.558 m Z=0.645 m With the aid of (17) and data for the transversal wave, the components of the directional vector in the x-y plane are calculated as follows X/r=−0.131

Y/r=0.991 which gives

X=−0.073 m

Y=0.553 m that is, the position of the sound source is completely located. Also in this case, an accurate location with a positional error of one or a few cm was obtained.

In the two examples mentioned above, the total transit times for the acoustic waves have been assumed to be known. As described above, a location would also have been possible if only the differences in transit times could have been measured. For the direct waves, it would have been possible to determine only the direction to the sound source (from the expressions (14)). For wall-propagated waves, the direction can be determined from the expressions (17), but, in addition, for such waves, further location information may be obtained with the aid of the expressions (5)–(8).

The invention has been described above as applied to PD location in a power transformer. However, the invention may be applied to PD location also in high-voltage apparatuses other than transformers, such as inductors. Further, the invention may be applied to insulating media other than oil, for example in $SF_6$—filled apparatus or in apparatus where the insulating medium consists of an epoxy resin.

An essential feature of the invention is that the detectors are placed near each other. It has been found that the distance between the detectors should be less than 0.20 m for the desired good location properties to be obtained, and preferably the distance should be equal to or less than 0.15 m. A lower limit is, however, set by the physical dimensions of the detectors in the lateral direction.

With the method described above and the detector unit according to the invention described above, three detectors have been used which are placed at the corners of an equilateral triangle. This embodiment of the invention has proved to provide a simple and advantageous device and simple calculations during the location. Alternatively, however, the number of detectors may be greater than three, for example four, and the detectors may be placed in some other way relative to each other than that described above.

Possibly, according to the invention, two detector triangles may be used arranged at a distance from each other, possibly arranged in the same detector unit, for increasing the possibility of a complete and exact location. According to another alternative, a plurality of detector sets, suitably arranged in a plurality of detector units, may be used and placed at different locations outside an apparatus to make possible monitoring and location of a larger part of the interior of the apparatus than what is possible with one single set of detectors.

What is claimed is:

1. A device for location of partial discharges in an electrical high voltage apparatus which is arranged in a container filled with an insulating medium said device comprising a detector unit on which at least three detectors are mounted, a distance between the individual detectors being less than a distance from the detector unit to any object in the container, the detector unit being adapted to be arranged on the outside of the container and the detectors are at the same time brought into acoustic contact with the container; and evaluation means connected to the detectors for determining the arrival time of an acoustic wavefront originated from a partial discharge, and for determining whether the wavefront is directly or wall-propagated, in order to obtain information for locating the partial discharge.

2. A device according to claim 1, further comprising current-supply members, physically separated from the detector unit, for current supply of the detector unit via a dc-carrying electric cable.

3. A device according to claim 1, further comprising means for electrical detection of the time of the partial discharge, and wherein the time-measuring means determine the time interval between the time of the discharge and the arrival at each of the detectors of the acoustic wavefront originating from the discharge.

4. A device according to claim 1, comprising three detectors arranged at the corners of an equilateral triangle.

5. A device according to claim 4, wherein the distances between the detectors are less than 0.2 m.

6. A device according to claim 5, wherein the distances between the detectors are at most 0.15 m.

7. A method for location of partial discharges in an electric high-voltage apparatus arranged in a container filled with an insulating medium, comprising:

applying at least three detectors, mounted in a detector unit with known positions, to a wall of the container to be in acoustic contact therewith;

determining times of arrivals of a wavefront originating from the partial discharge at the detectors;

determining whether each of the detectors has detected a direct wave or a wall-propagated wave; and deriving information for locating the partial discharge from the detector unit based on known positions of the individual detectors, the type of wave detected, and the difference between the times of arrival of the wavefront at different detectors.

8. A method according to claim 7, comprising three detectors placed at the corners of an equilateral triangle.

9. A method according to claim 7, wherein the detectors are applied to the container wall with a mutual distance which is smaller than 0.2 m.

10. A method according to claim 7, wherein the detectors are applied to the container wall with a mutual distance which does not exceed 0.15 m.

11. A method according to claim 7, wherein for direct waves, the total time of propagation is measured and the distance to the discharge is determined on the basis of the measured time and the acoustic velocity in the insulating medium.

12. A method according to claim 7, wherein the times of arrival for wall-propagated longitudinal and transversal waves are measured separately and, on the basis of the measured times and of the acoustic velocities in the container wall for the two wave types, the distance in the plane of the wall to the discharge and the distance of the discharge from the wall are calculated.

13. A method according to claim 7, wherein the times of arrival for the wavefront at each one of the detectors are determined and on the basis of these times and of the known distances between the detectors, an apparent velocity for a wall-propagated wave is calculated.

14. A method according to claim 13, wherein the calculated apparent velocity is compared with the known acoustic velocity in the wall for determining whether the wavefront originates from direct waves or from wall-propagated waves.

* * * * *